(12) United States Patent
Yasuda et al.

(10) Patent No.: US 11,387,910 B2
(45) Date of Patent: Jul. 12, 2022

(54) OPTICAL MODULE, TRANSMISSION DEVICE, AND OPERATING POINT CONTROL METHOD

(71) Applicant: Fujitsu Optical Components Limited, Kawasaki (JP)

(72) Inventors: Shuichi Yasuda, Sapporo (JP); Tamotsu Akashi, Atsugi (JP)

(73) Assignee: FUJITSU OPTICAL COMPONENTS LIMITED, Kawasaki (JP)

(*) Notice: Subject to any disclaimer, the term of this patent is extended or adjusted under 35 U.S.C. 154(b) by 284 days.

(21) Appl. No.: 16/864,399

(22) Filed: May 1, 2020

(65) Prior Publication Data
US 2020/0381895 A1 Dec. 3, 2020

(30) Foreign Application Priority Data
Jun. 3, 2019 (JP) .............................. JP2019-103508

(51) Int. Cl.
*H04B 10/04* (2006.01)
*H04B 10/54* (2013.01)
(Continued)

(52) U.S. Cl.
CPC ......... *H04B 10/54* (2013.01); *H04B 10/5051* (2013.01); *H04B 10/5057* (2013.01);
(Continued)

(58) Field of Classification Search
CPC ............... H04B 10/54; H04B 10/5057; H04B 10/50575; H04B 10/50577; H04B 10/5059; H04B 10/50595; H04B 10/5053; H04B 10/40; H04B 10/2507; H04B 10/516; H04B 10/564; G02F 1/0123; G02F 1/225; G02F 1/2255
USPC ....... 398/183, 186, 187, 188, 192, 193, 194, 398/195, 196, 197, 198, 199, 200, 201, 398/33, 38, 158, 159, 135, 136; 359/237, 359/238, 239, 245, 248, 276; 385/1, 2, 3
See application file for complete search history.

(56) References Cited

U.S. PATENT DOCUMENTS

2004/0161249 A1 8/2004 Suda et al.
2005/0068600 A1 3/2005 Ogura
(Continued)

FOREIGN PATENT DOCUMENTS

JP 2004-247968 9/2004

*Primary Examiner* — Hanh Phan
(74) *Attorney, Agent, or Firm* — Staas & Halsey LLP

(57) ABSTRACT

An optical module includes an optical device that outputs an optical signal corresponding to a control voltage, a voltage controller that applies the control voltage on which a dither signal is superimposed to the optical device, a monitor unit that monitors the optical signal output from the optical device, and outputs a monitor signal, a multiplier that multiplies the monitor signal by a reference signal corresponding to the dither signal, a filter unit that extracts a direct-current component included in a multiplication result, and a controller that causes the voltage controller to change the control voltage in accordance with the direct-current component. The controller changes the frequency of the dither signal or the reference signal such that the frequency of the reference signal is twice as large as that of the dither signal, when the direct-current component satisfies a predetermined condition.

6 Claims, 11 Drawing Sheets

(51) Int. Cl.
*H04B 10/50* (2013.01)
*H01S 5/00* (2006.01)

(52) U.S. Cl.
CPC ........ *H04B 10/5059* (2013.01); *H01S 5/0085* (2013.01); *H04B 2210/075* (2013.01)

(56) References Cited

U.S. PATENT DOCUMENTS

| | | | | |
|---|---|---|---|---|
| 2009/0060528 | A1* | 3/2009 | Takashima | H04B 10/50572 398/186 |
| 2010/0129088 | A1* | 5/2010 | Akasaka | H04B 10/50577 398/188 |
| 2018/0074348 | A1* | 3/2018 | Fujita | H04B 10/5561 |

* cited by examiner

OPTICAL MODULE, TRANSMISSION DEVICE, AND OPERATING POINT CONTROL METHOD

CROSS-REFERENCE TO RELATED APPLICATION

This application is based upon and claims the benefit of priority of the prior Japanese Patent Application No. 2019-103508, filed on Jun. 3, 2019, the entire contents of which are incorporated herein by reference.

FIELD

The embodiments discussed herein are related to an optical module, a transmission device, and an operating point control method.

BACKGROUND

Generally, transmission devices transmitting optical signals are equipped with optical modules provided with optical devices, such as modulators. Optical modules may be provided with optical devices, such as variable optical attenuators (VOA) and tunable optical filters (TOF), as well as modulators. To acquire desired optical output characteristics with these optical devices, the control voltages applied to the respective optical devices are regulated to optimum operating points. Specifically, in a curve illustrating the optical output characteristic of each of the optical devices, there are cases where the control voltage at which optical intensity of the output light becomes maximum or minimum is determined as an optimum operating point.

As a method for determining such an operating point, for example, there is a method of monitoring the output light from the optical device while a dither signal at a predetermined low frequency is superimposed on the control voltage, and detecting a dither signal component included in the acquired monitor signal. To detect the dither signal component, for example, a band pass filter having a pass band equal to the frequency of the dither signal is used. Shift quantity from the optimum operating point is calculated on the basis of the output from the band pass filter, and the control voltage is regulated.

Patent Document 1: US Patent Application Publication No. 2005/0068600

Patent Document 2: Japanese Laid-open Patent Publication No. 2004-247968

In recent years, multi-valuing of the modulation method has been advanced, and a difference in phase and amplitude between different symbols has become small. Specifically, an interval between points indicating different symbols on the IQ plane has become small. For this reason, when the control voltage of, for example, the modulator fluctuates by superimposition of a dither signal, the phase and the amplitude of the transmission symbol also fluctuate, and the transmission property deteriorates. For this reason, it is preferable that the amplitude of a dither signal is decreased as much as possible.

However, when the amplitude of a dither signal is decreased, there is the problem that the amplitude of the dither signal component in the monitor signal also decreases and detection of the dither signal component becomes difficult. Specifically, it becomes difficult to distinguish the dither signal component included in the monitor signal from noise, and detection accuracy of the dither signal component decreases. In addition, in particular, when the control voltage becomes close to the maximum point or the minimum point of the optical output characteristic curve, the inclination of the optical output characteristic curve becomes close to zero, fluctuations of the control voltage caused by the dither signal becomes hard to appear in the optical intensity of the output light, and the dither signal component included in the monitor signal becomes small. For this reason, when the control voltage becomes close to the optimum operating point, detection accuracy of the dither signal component in the monitor signal further decreases. As a result, determination of the optimum operating point becomes difficult, and a desired optical output characteristic of the optical device is not achieved.

SUMMARY

According to an aspect of an embodiment, an optical module includes: an optical device that outputs an optical signal with an optical output characteristic corresponding to a control voltage; a voltage controller that applies the control voltage on which a dither signal having a known frequency is superimposed to the optical device; a monitor unit that monitors the optical signal output from the optical device, and outputs a monitor signal corresponding to the optical signal output; a multiplier that multiplies the monitor signal by a reference signal having a frequency corresponding to the dither signal; a filter unit that extracts a direct-current component included in a multiplication result of the multiplier; and a controller that causes the voltage controller to change the control voltage in accordance with the direct-current component extracted with the filter unit. The controller changes the frequency of the dither signal or the reference signal such that the frequency of the reference signal is twice as large as the frequency of the dither signal, when the direct-current component extracted with the filter unit satisfies a predetermined condition.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present invention is not limited to the embodiments.

[a] First Embodiment

Figure 1:
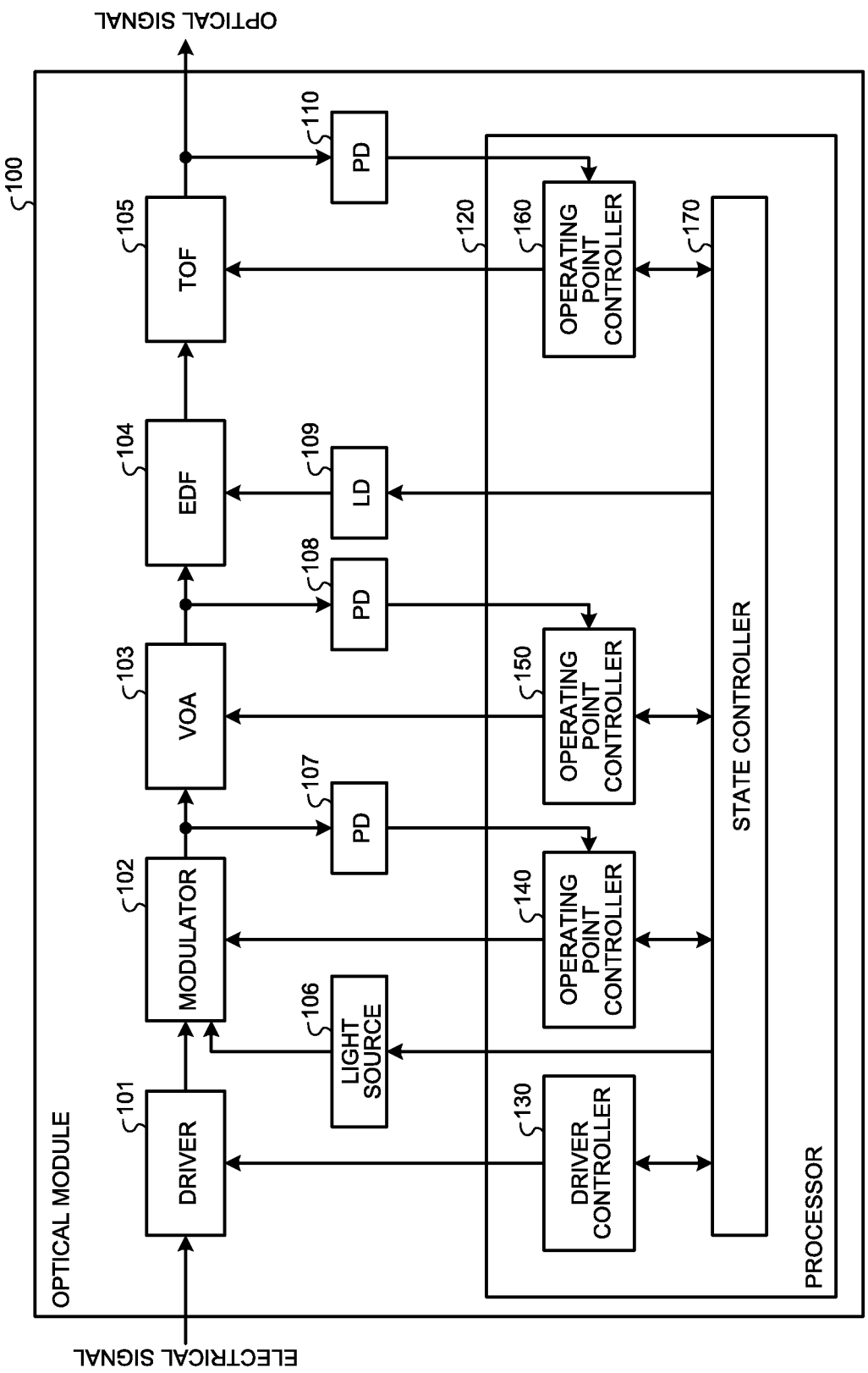
FIG. 1 is a block diagram illustrating a configuration of an optical module according to a first embodiment.

FIG. 1 is a block diagram illustrating a configuration of an optical module 100 according to a first embodiment. The optical module 100 illustrated in FIG. 1 is mounted on, for example, a transmission device transmitting optical signals. The optical module 100 includes a driver 101, a modulator 102, a variable optical attenuator (VOA) 103, an erbium doped fiber (EDF) 104, a tunable optical filter (TOF) 105, a light source 106, photo diodes (PD) 107, 108, and 110, a laser diode (LD) 109, and a processor 120.

When a high-frequency electrical signal including transmission data is input to the driver 101, the driver 101 amplifies the electrical signal to a predetermined amplitude. The driver 101 outputs the amplified electrical signal to the modulator 102.

The modulator 102 is an optical device modulating light generated with the light source 106 with the electrical signal input from the driver 101, to generate an optical signal. The modulator 102 outputs the generated optical signal to the VOA 103. The operating point of the modulator 102 is controlled with the processor 120. Specifically, the central voltage of the electrical signal input from the driver 101 is regulated with the processor 120.

The VOA 103 is an optical device attenuating the optical signal input from the modulator 102. The VOA 103 outputs the attenuated optical signal to the EDF 104. The operating point of the VOA 103 is controlled with the processor 120. Specifically, the attenuation quantity of the optical signal is set with the processor 120.

The EDF 104 amplifies the optical signal input from the VOA 103 using excitation light output from the LD 109. The EDF 104 outputs the amplified optical signal to the TOF 105.

The TOF 105 is an optical device removing a noise component of the optical signal input from the EDF 104. The optical signal output from the TOF 105 is transmitted from a transmitter (not illustrated) using an optical fiber or the like. The operating point of the TOF 105 is controlled with the processor 120. Specifically, the pass band of the optical signal is set with the processor 120.

The light source 106 outputs non-modulated light at a predetermined frequency. The light source 106 may include, for example, a small-sized integrable tunable laser assembly (ITLA). The timing of output of the non-modulated light with the light source 106 and/or the frequency and the optical intensity of the non-modulated light are controlled with the processor 120.

The PD 107 separates part of the optical signal output from the modulator 102, and converts the part of the optical signal into an electrical signal. Specifically, the PD 107 monitors the optical signal output from the modulator 102. The PD 107 outputs a monitor signal acquired by converting the part of the optical signal into an electrical signal to the processor 120.

The PD 108 separates part of the optical signal output from the VOA 103, and converts the part of the optical signal into an electrical signal. Specifically, the PD 108 monitors the optical signal output from the VOA 103. The PD 108 outputs a monitor signal acquired by converting the part of the optical signal into an electrical signal to the processor 120.

The LD 109 outputs excitation light used for optical amplification in the EDF 104. The optical intensity of the excitation light output from the LD 109 is controlled with the processor 120.

The PD 110 separates part of the optical signal output from the TOF 105, and converts the part of the optical signal into an electrical signal. Specifically, the PD 110 monitors the optical signal output from the TOF 105. The PD 110 outputs a monitor signal acquired by converting the part of the optical signal into an electrical signal to the processor 120.

The processor 120 includes, for example, a central processing unit (CPU), a field programmable gate array (FPGA), or a digital signal processor (DSP), and controls the whole optical module 100 in an integrated manner. Specifically, the processor 120 includes a driver controller 130, an operating point controllers 140, 150, and 160, and a state controller 170.

The driver controller 130 controls an amplification rate of the electrical signal in the driver 101.

The operating point controller 140 controls the operating point of the modulator 102 to an optimum value. Specifically, the operating point controller 140 superimposes a dither signal having a predetermined frequency on a control voltage applied to the modulator 102, and regulates the control voltage using a dither signal component included in the monitor signal output from the PD 107.

The operating point controller 150 controls the operating point of the VOA 103 to an optimum value. Specifically, the operating point controller 150 superimposes a dither signal having a predetermined frequency on a control voltage applied to the VOA 103, and regulates the control voltage using a dither signal component included in the monitor signal output from the PD 108.

The operating point controller 160 controls the operating point of the TOF 105 to an optimum value. Specifically, the operating point controller 160 superimposes a dither signal having a predetermined frequency on a control voltage applied to the TOF 105, and regulates the control voltage using a dither signal component included in the monitor signal output from the PD 110.

The configurations of the operating point controllers 140, 150, and 160 will be described in detail later.

The state controller 170 controls turning on and off of the optical module 100, and monitors control in each of the controllers. Specifically, when the optical module 100 is started, the state controller 170 turns on the light source 106 and regulates the frequency and the optical intensity of the non-modulated light. When the operation of the light source 106 is stabilized, the state controller 170 turns on the driver controller 130 to control the driver 101. Thereafter, when control of the driver 101 is stabilized, the state controller 170 successively turns on the operating point controllers 140, 150, and 160 to stabilize controls of the modulator 102, the VOA 103, and the TOF 105. In addition, after the optical module 100 is started, the state controller 170 monitors the state of each of the controllers, and determines whether all the controls are stabilized. When any controller control of which is not stabilized exists, the state controller 170 issues a warning to the user or the like.

Figure 2:
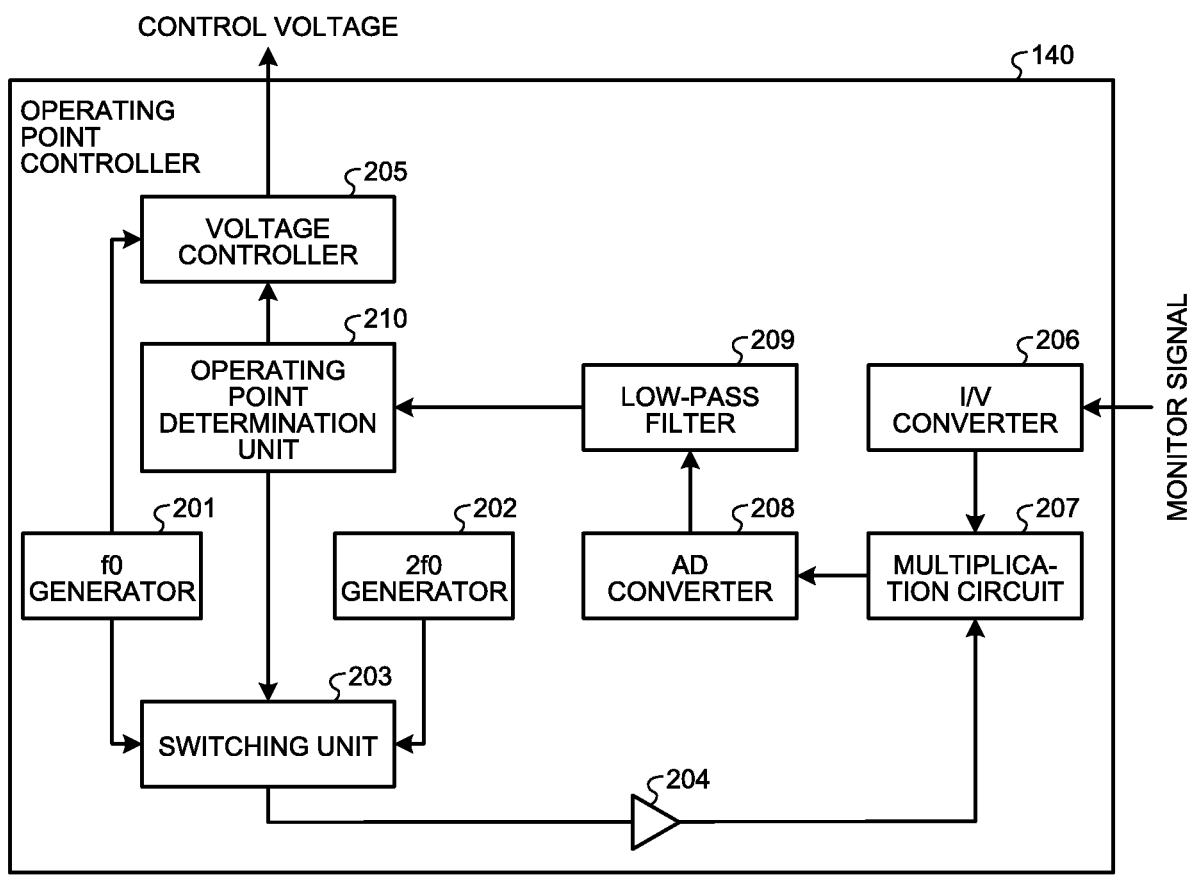
FIG. 2 is a block diagram illustrating a configuration of an operating point controller according to the first embodiment.

FIG. 2 is a block diagram illustrating a configuration of the operating point controller 140 according to the first embodiment. The operating point controllers 150 and 160 have the same configuration as that of the operating point controller 140, except that the operating point control target thereof is different. The operating point controller 140 illustrated in FIG. 2 includes an f0 generator 201, a 2f0 generator 202, a switching unit 203, an amplifier 204, a voltage controller 205, an I/V converter 206, a multiplication circuit 207, an analog digital (AD) converter 208, a low-pass filter 209, and an operating point determination unit 210.

The f0 generator 201 generates a signal (hereinafter referred to as "f0 signal") having a frequency f0 and used as a dither signal. The frequency f0 is preferably a frequency sufficiently lower than that of the electrical signal including transmission data. The f0 generator 201 outputs the generated f0 signal to the switching unit 203 and the voltage controller 205.

The 2f0 generator 202 generates a signal (hereinafter referred to as "2f0 signal") having a frequency 2f0 twice as large as that of the dither signal. The 2f0 generator 202 outputs the generated 2f0 signal to the switching unit 203.

The switching unit 203 outputs the f0 signal or the 2f0 signal as a reference signal to be multiplied by the monitor signal to the amplifier 204, in accordance with an instruction from the operating point determination unit 210. Specifically, when the operating point of the modulator 102 becomes close to the optimum value, the switching unit 203 switches the reference signal from the f0 signal to the 2f0 signal. By contrast, when the operating point of the modulator 102 becomes distant from the optimum value, the switching unit 203 switches the reference signal from the 2f0 signal to the f0 signal.

The amplifier 204 amplifies the reference signal output from the switching unit 203. Specifically, the amplifier 204 increases the amplitude of the reference signal. The amplifier 204 outputs the amplified reference signal to the multiplication circuit 207. Amplifying the reference signal with the amplifier 204 enables increase in sensitivity to the same frequency component in the monitor signal as the reference signal in the multiplication circuit 207.

The voltage controller 205 applies the control voltage to the modulator 102 to control the operating point. In this operation, the voltage controller 205 sets the voltage value of the control voltage in accordance with an instruction from the operating point determination unit 210, superimposes the f0 signal serving as the dither signal on the control voltage, and applies the control voltage to the modulator 102.

The I/V converter 206 amplifies the monitor signal output from the PD 107 by performing current-voltage conversion on the monitor signal. The I/V converter 206 outputs the amplified monitor signal to the multiplication circuit 207.

The multiplication circuit 207 multiplies the monitor signal by the reference signal, and detects the dither signal included in the monitor signal. Specifically, the multiplication circuit 207 multiplies the monitor signal monitored with the PD 107 by the f0 signal or the 2f0 signal corresponding to the dither signal component. By the multiplication, when the same frequency component as the reference signal is included in the monitor signal, a direct-current component occurs in the multiplication result. Accordingly, when the reference signal is the f0 signal, the multiplication circuit 207 outputs the multiplication result including a direct-current component when the dither signal component having the frequency f0 is included in the monitor signal. When the reference signal is the 2f0 signal, the multiplication circuit 207 outputs the multiplication result including a direct-current component when the dither signal component having the frequency 2f0 is included in the monitor signal. Because the magnitude of the direct-current component is proportional to the magnitude of the amplitude of the multiplied reference signal, amplification of the reference signal with the amplifier 204 increases the direct-current component appearing in the multiplication result of the multiplication circuit 207. This structure enables accurate detection of the dither signal component from the monitor signal.

The AD converter 208 performs A/D conversion on the multiplication result output from the multiplication circuit 207, and outputs the digital multiplication result to the low-pass filter 209.

The low-pass filter 209 filters the multiplication result to extract the direct-current component included in the multiplication result. Specifically, the low-pass filter 209 removes the alternating-current component of the multiplication result, and extracts the direct-current component with a 0 frequency.

The operating point determination unit 210 performs control such that the operating point of the modulator 102 becomes close to the optimum value, on the basis of the output of the low-pass filter 209. Specifically, when the optical module 100 is started, the operating point determination unit 210 instructs the switching unit 203 to switch the reference signal to the f0 signal. In addition, the operating point determination unit 210 causes the voltage controller 205 to change the control voltage such that the direct-current component extracted with the low-pass filter 209 has a value equal to or smaller than a predetermined threshold. When the direct-current component becomes equal to or smaller than the predetermined threshold in the state in which the reference signal is the f0 signal, the operating point determination unit 210 instructs the switching unit 203 to switch the reference signal to the 2f0 signal. In addition, the operating point determination unit 210 causes the voltage controller 205 to change the control voltage such that the direct-current component extracted with the low-pass filter 209 increases. When the direct-current component becomes maximum in the state in which the reference signal is the 2f0 signal, the operating point determination unit 210 determines that the operating point has the optimum value.

Figure 3:
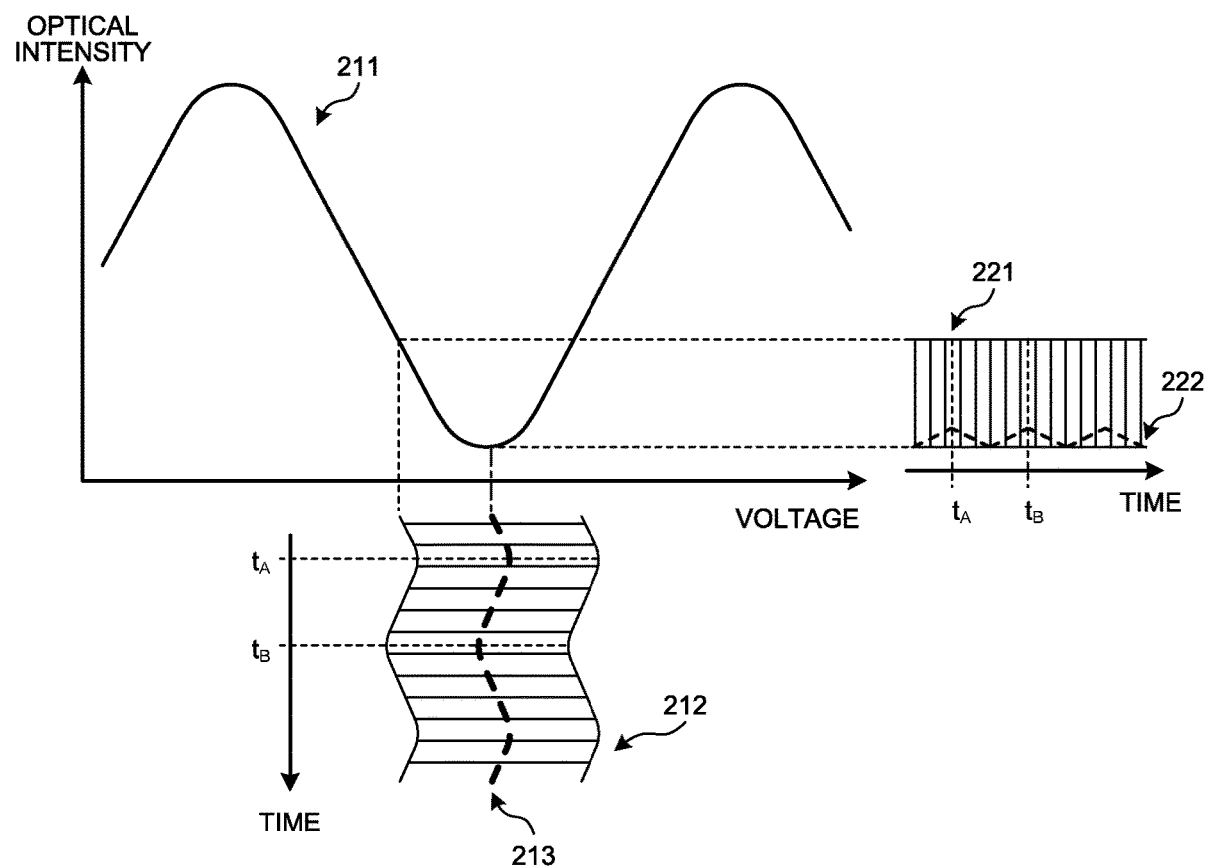
FIG. 3 is a diagram illustrating a specific example of relation between an operating point of a modulator and a monitor signal.
Figure 4:
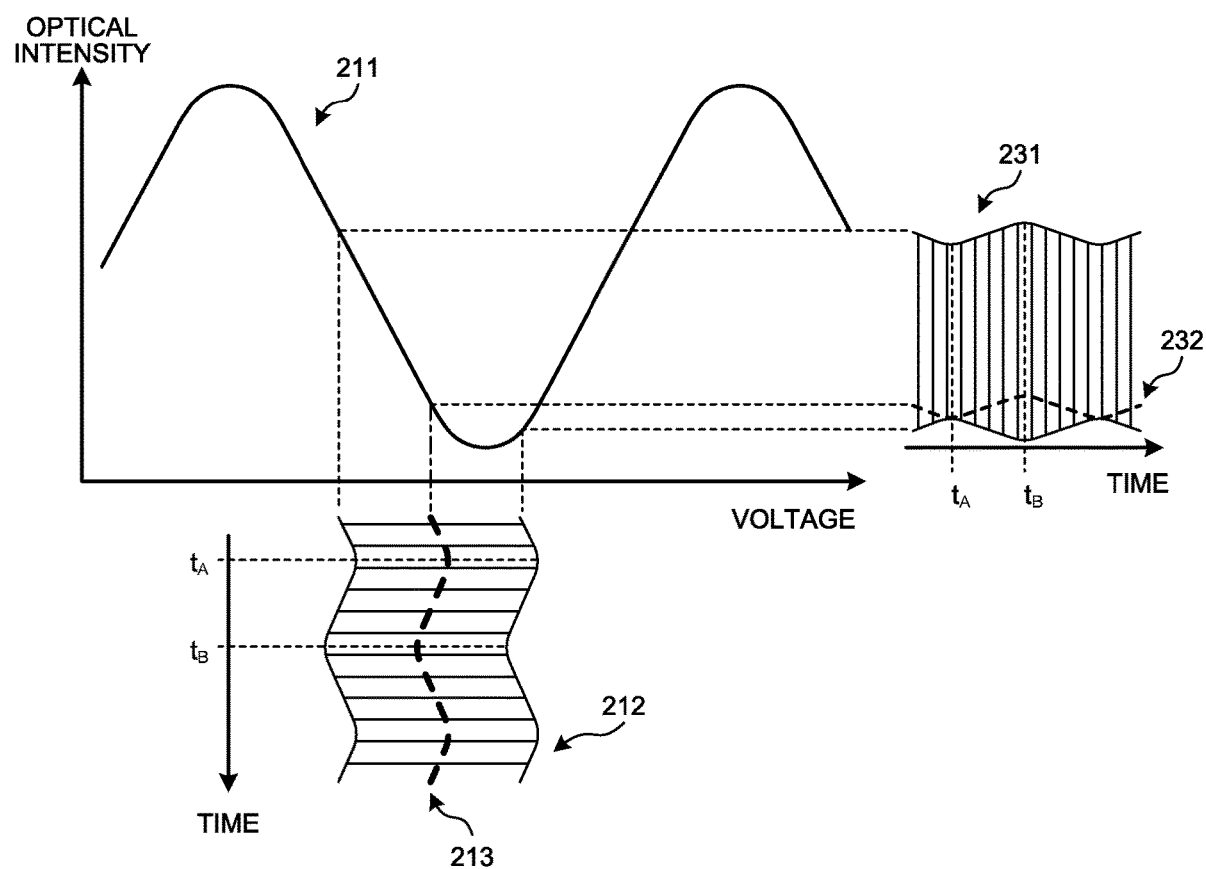
FIG. 4 is a diagram illustrating another specific example of relation between the operating point of the modulator and the monitor signal.
Figure 5:
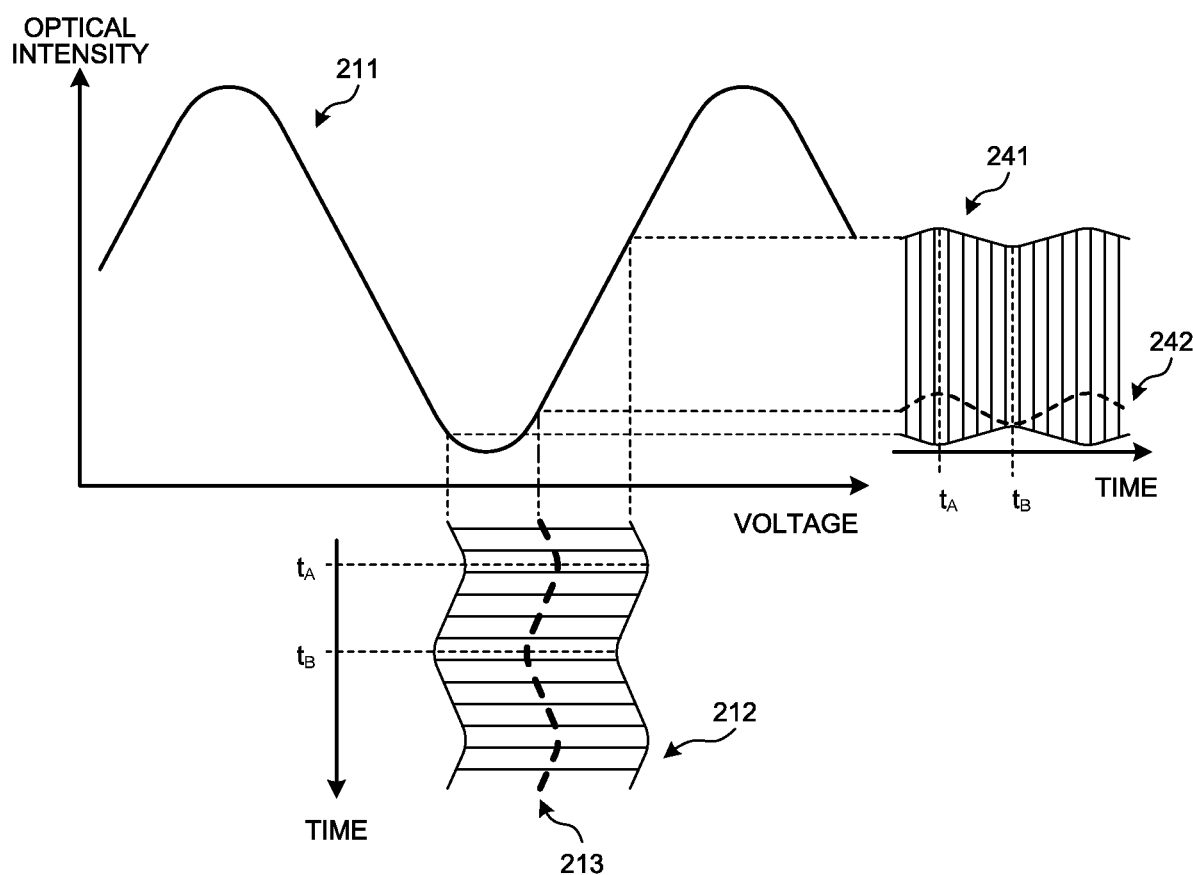
FIG. 5 is a diagram illustrating another specific example of relation between the operating point of the modulator and the monitor signal.

The following is an explanation of the operating point of the modulator 102 with reference to FIG. 3 to FIG. 5. FIG. 3 to FIG. 5 are diagrams illustrating specific examples of relation between the operating point of the modulator 102 and the monitor signal monitored with the PD 107.

As illustrated in FIG. 3, an optical output characteristic curve 211 of the modulator 102 is a curve including maximum points and a minimum point. A high-frequency electrical signal 212 is input from the driver 101 to the modulator 102, and the central voltage of the electrical signal 212 is the control voltage applied from the voltage controller 205. The control voltage applied from the voltage controller 205 serves as the operating point of the modulator 102. When the operating point corresponds to the maximum point or the minimum point of the optical output characteristic curve 211, an optical signal of a proper amplitude is output from the modulator 102. Specifically, the voltage corresponding to the maximum point or the minimum point of the optical output characteristic curve 211 serves as the optimum operating point of the modulator 102.

FIG. 3 illustrates the case where the operating point of the modulator 102 has the optimum value, and the central voltage of the electrical signal 212 is equal to the voltage corresponding to the minimum point of the optical output characteristic curve 211. Because a dither signal 213 having the frequency f0 is superimposed on the control voltage applied from the voltage controller 205 to the modulator 102, a monitor signal 221 in the PD 107 includes a dither signal component 222. In this example, because the operating point of the modulator 102 has the optimum value, the frequency of the dither signal component 222 is 2f0 that is twice as large as the frequency f0 of the dither signal 213. Specifically, because the central voltage corresponds to the minimum point of the optical output characteristic curve 211, the dither signal 213 having an opposite phase at time $t_A$ and time $t_B$ appears as maximum points having the same phase in the dither signal component 222, and the frequency of the dither signal component 222 is twice as large as the frequency of the dither signal 213.

FIG. 4 illustrates the case where the operating point of the modulator 102 is smaller than the optimum value, and the central voltage of the electrical signal 212 is smaller than the voltage corresponding to the minimum point of the optical output characteristic curve 211. In this case, the amplitude of a monitor signal 231 in the PD 107 is larger than the proper amplitude, and the frequency of the dither signal component 232 is equal to the frequency f0 of the dither signal 213. Specifically, because the central voltage is shifted from the minimum point of the optical output characteristic curve 211, the dither signal 213 having an opposite phase at the time $t_A$ and the time $t_B$ appears as a minimum point and a maximum point having an opposite phase also in the dither signal component 232, and the frequency of the dither signal component 232 is equal to the frequency of the dither signal 213. In addition, the phase of the dither signal component 232 is a phase reversed from that of the dither signal 213.

FIG. 5 illustrates the case where the operating point of the modulator 102 is larger than the optimum value, and the central voltage of the electrical signal 212 is larger than the voltage corresponding to the minimum point of the optical output characteristic curve 211. In this case, the amplitude of a monitor signal 241 in the PD 107 is larger than the proper amplitude, and the frequency of a dither signal component 242 is equal to the frequency f0 of the dither signal 213. Specifically, because the central voltage is shifted from the minimum point of the optical output characteristic curve 211, the dither signal 213 having an opposite phase at the time $t_A$ and the time $t_B$ appears as a minimum point and a maximum point having an opposite phase also in the dither signal component 242, and the frequency of the dither signal component 242 is equal to the frequency of the dither signal 213. In addition, the phase of the dither signal component 242 is a forward phase of the dither signal 213.

As described above, in the monitor signal of the PD 107, as the operating point of the modulator 102 becomes distant from the optimum value, the dither signal component having the frequency f0 increases, and the dither signal component having the frequency 2f0 decreases. By contrast, as the operating point of the modulator 102 becomes close to the optimum value, the dither signal component having the frequency f0 decreases, and the dither signal component having the frequency 2f0 increases. For this reason, when the operating point of the modulator 102 becomes close to the optimum value to a certain degree, the operating point determination unit 210 switches the reference signal from the f0 signal to the 2f0 signal to change the control voltage such that the dither signal component having the frequency 2f0 in the monitor signal increases.

Figure 6:
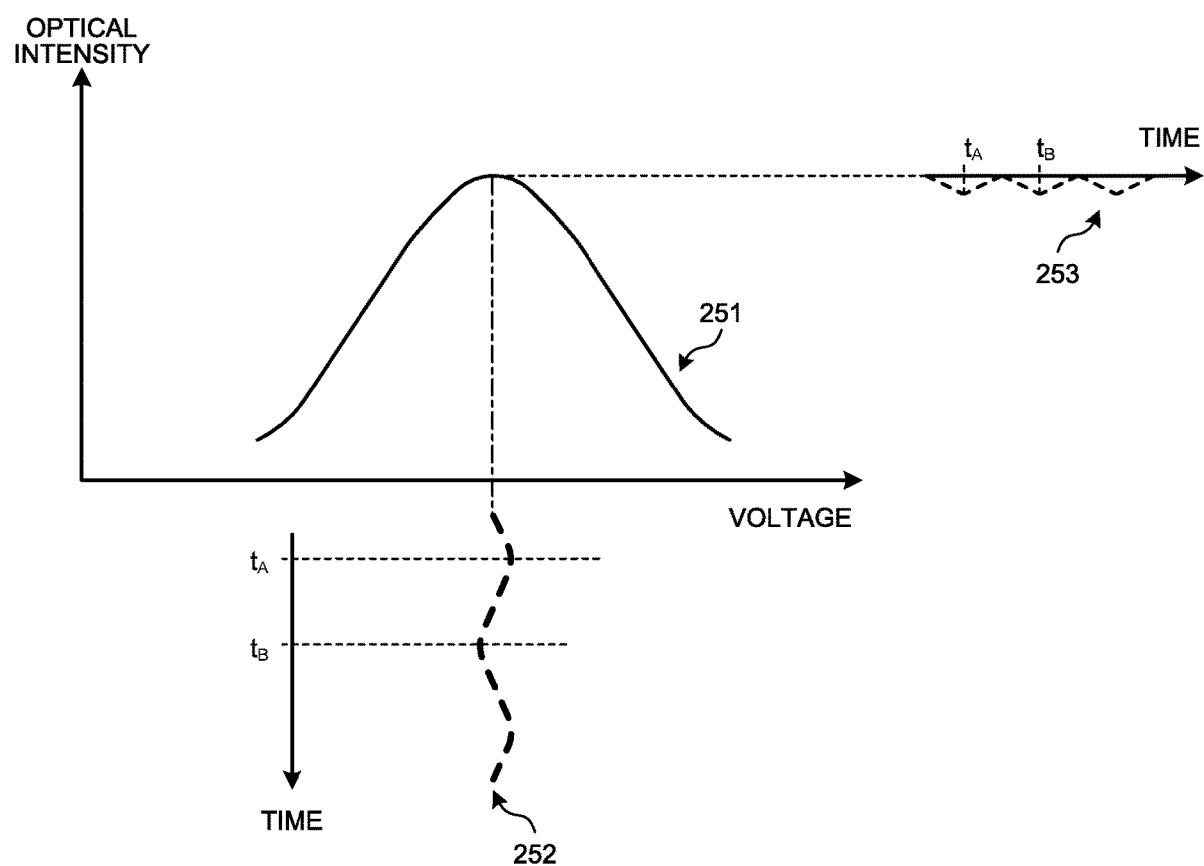
FIG. 6 is a diagram illustrating a specific example of relation between another operating point and a monitor signal.

In this example, the operating point of the modulator 102 has been explained, but the operating points of the VOA 103 and the TOF 105 can be brought close to the respective optimum values by the similar processing. FIG. 6 is a diagram illustrating the case where the operating point of the VOA 103 or the TOF 105 has the optimum value. As illustrated in FIG. 6, an optical output characteristic curve 251 of the VOA 103 or the TOF 105 is a curve projecting upward. Respective control voltages are applied to the VOA 103 and the TOF 105 from the operating point controllers 150 and 160, respectively. The control voltages applied from the operating point controllers 150 and 160 serve as the operating points of the VOA 103 and the TOF 105, respectively, and voltages with which desired optical intensities are acquired serve as optimum operating points of the VOA 103 and the TOF 105. To operate the VOA 103 and the TOF 105 at optimum operating points, the operating point controllers 150 and 160 specify maximum points of the respective optical output characteristic curves 251 of the VOA 103 and the TOF 105, respectively, and determine the control voltages with which the desired optical intensities can be acquired, on the basis of the voltages corresponding to the maximum points.

FIG. 6 illustrates the case where a dither signal 252 is superimposed on the control voltage corresponding to the maximum point of an optical output characteristic curve 251. When the dither signal 252 is superimposed on the control voltage, a dither signal component 253 is included in each of the monitor signals in the PD 108 and the PD 110. In this example, because the dither signal 252 is superimposed on the control voltage corresponding to the maximum point of the optical output characteristic curve 251, the frequency of the dither signal component 253 is 2f0 that is twice as large as the frequency f0 of the dither signal 252. Specifically, because the control voltage corresponds to the maximum point of the optical output characteristic curve 251, the dither signal 252 having an opposite phase at the time $t_A$ and the time $t_B$ appears as the minimum points having the same phase in the dither signal component 253, and the frequency of the dither signal component 253 is twice as large as the frequency of the dither signal 252.

By contrast, although illustration thereof is omitted, when the control voltage is shifted from the maximum point of the optical output characteristic curve 251, the frequency of the dither signal component is equal to the frequency of the dither signal. For this reason, in the same manner as the processing of bringing the operating point of the modulator 102 close to the optimum value as described above, the operating point controllers 150 and 160 can specify the maximum points of the optical output characteristic curves 251 of the VOA 103 and the TOF 105, respectively. In addition, the operating point controllers 150 and 160 determine the control voltages of the VOA 103 and the TOF 105 to acquire desired optical intensities, on the basis of the specified maximum points.

Figure 7:
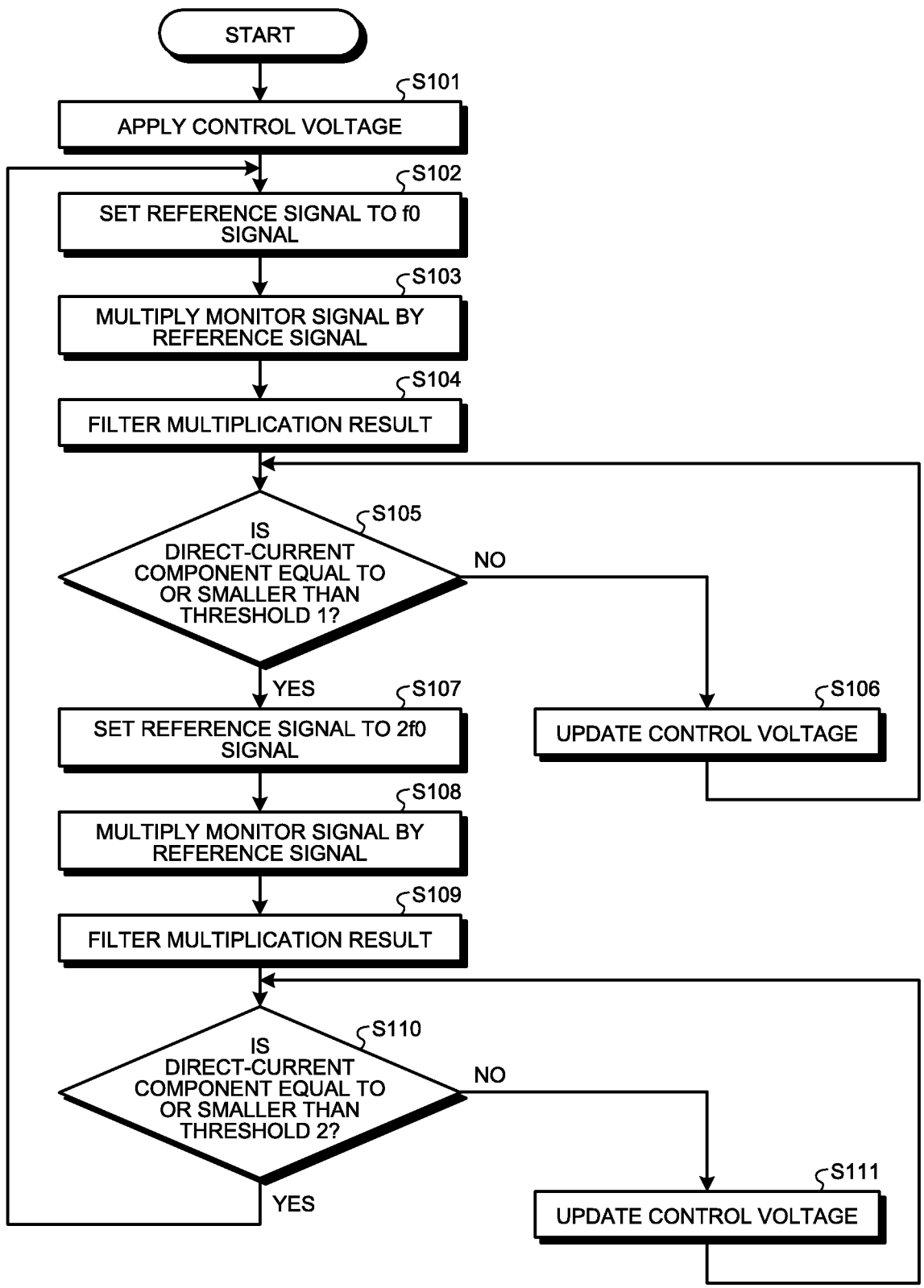
FIG. 7 is a flowchart illustrating an operating point control method according to the first embodiment.

The following is an explanation of the operating point control method in the optical module 100 structured as described above, with reference to the flowchart illustrated in FIG. 7. The following explanation illustrates the operating point control method for controlling the operating point of the modulator 102.

When the optical module 100 is started, the control voltage having a predetermined initial value is applied to the modulator 102 with the voltage controller 205 (Step S101). Because the f0 signal output from the f0 generator 201 is superimposed on the control voltage in the voltage controller 205, the control voltage on which the f0 signal is superimposed is applied to the modulator 102. In addition, by controlling the switching unit 203 with the operating point determination unit 210, the reference signal output to the multiplication circuit 207 is set to the f0 signal (Step S102). Specifically, the f0 signal generated with the f0 generator 201 is set to be output from the switching unit 203 to the amplifier 204. The reference signal output from the switching unit 203 is amplified with the amplifier 204, and output to the multiplication circuit 207.

In the meantime, when the control voltage is applied to the modulator 102, light output from the light source 106 is modulated with the electrical signal output from the driver 101, and an optical signal is output from the modulator 102. The optical signal is monitored with the PD 107, and a monitor signal is input to the I/V converter 206. With the I/V converter 206, the monitor signal is amplified by current-voltage conversion, and output to the multiplication circuit 207. In this manner, because the monitor signal and the reference signal (f0 signal in this operation) are input to the multiplication circuit 207, multiplication of the monitor signal and the reference signal is performed (Step S103).

The multiplication result is subjected to A/D conversion with the AD converter 208, and filtered with the low-pass filter 209 (Step S104). Because the low-pass filter 209 transmits only a low-frequency band component of the multiplication result, the low-pass filter 209 outputs a direct-current component included in the multiplication result. The direct-current component is input to the operating point determination unit 210, and used for determination to bring the operating point of the modulator 102 close to the optimum value.

Figure 8:
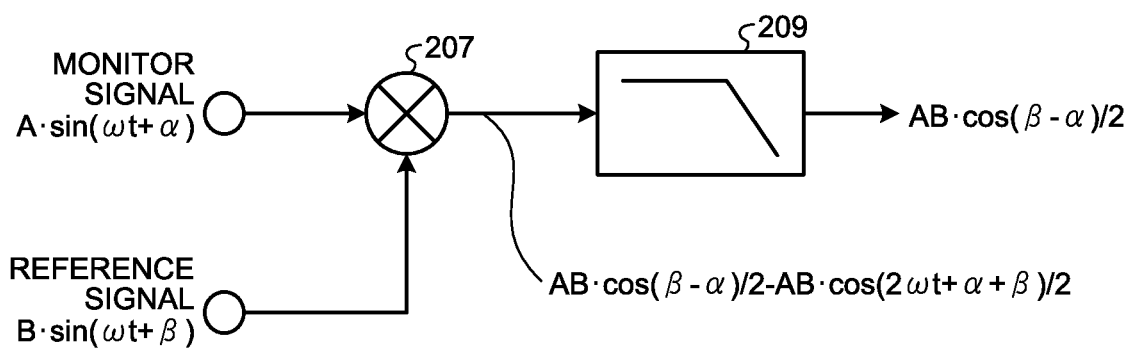
FIG. 8 is a diagram explaining a low-pass filter output.

The following is an explanation of the direct-current component output from the low-pass filter 209, with reference to FIG. 8. FIG. 8 is a diagram explaining multiplication of a monitor signal of amplitude A and a reference signal of amplitude B. As illustrated in FIG. 8, both the monitor signal and the reference signal have a sine wave, and have the same frequency (the same angular velocity of $\omega$).

When the monitor signal and the reference signal have the same frequency, the multiplication result output from the multiplication circuit 207 is:

$$AB \cdot \cos(\beta-\alpha)/2 - AB \cdot \cos(2\omega t + \alpha + \beta)/2.$$

In the multiplication result, the first term is a direct-current component proportional to the amplitude of the monitor signal and the reference signal, while the second term is an alternating-current component fluctuating with the time (t). For this reason, when the multiplication result is filtered with the low-pass filter 209, the alternating-current component is removed, and the value $AB \cdot \cos(\beta-\alpha)/2$ serving as the direct-current component is output, as illustrated in FIG. 8. Accordingly, in the case where the monitor signal including the dither signal component having the frequency f0 is multiplied by the reference signal, when the reference signal is an f0 signal, the direct-current component included in the multiplication result is output from the low-pass filter 209.

By contrast, when the monitor signal and the reference signal have different frequencies, no direct-current component appears in the multiplication result. Accordingly, in the case where the monitor signal including the dither signal component having the frequency f0 is multiplied by the reference signal, when the reference signal is not an f0 signal, no direct-current component is included in the multiplication result, and no component is output from the low-pass filter 209.

In addition, as described above, the direct-current component output from the low-pass filter 209 when the monitor signal and the reference signal have the same frequency is proportional to the amplitude of the monitor signal and the reference signal. For this reason, even when the amplitude of the monitor signal is small, the direct-current component can be increased by increasing the amplitude of the reference signal. For this reason, in the present embodiment, the amplifier 204 amplifies the reference signal to amplify the direct-current component output from the low-pass filter 209 when the monitor signal and the reference signal have the same frequency. As a result, even when the amplitude of the dither signal is small and the amplitude of the dither signal component included in the monitor signal is small, it is possible to accurately detect the dither signal component having the same frequency as that of the reference signal.

With reference to FIG. 7 again, when the direct-current component is input to the operating point determination unit 210, it is determined whether the direct-current component is equal to or smaller than a predetermined threshold 1 (Step S105). As explained with reference to FIG. 3 to FIG. 5, because the dither signal component having the frequency f0 included in the monitor signal decreases as the operating point of the modulator 102 becomes close to the optimum value, when the reference signal is the f0 signal, the direct-current component decreases as the operating point of the modulator 102 becomes close to the optimum value. For this reason, when the direct-current component is not equal to or smaller than the predetermined threshold 1 (No at Step S105), it is determined that the operating point of the modulator 102 is distant from the optimum value, and the control voltage applied to the modulator 102 with the voltage controller 205 is updated (Step S106). The updated value of the control voltage may be a value instructed from the operating point determination unit 210.

By contrast, when the direct-current component is equal to or smaller than the predetermined threshold 1 (Yes at Step S105), it is determined that the operating point of the modulator 102 becomes close to the optimum value, and the reference signal is switched to the 2f0 signal with an instruction issued from the operating point determination unit 210 to the switching unit 203 (Step S107). Specifically, with the switching unit 203, the 2f0 signal output from the 2f0 generator 202 is output as the reference signal to the amplifier 204, not the f0 signal output from the f0 generator 201. The reference signal output from the switching unit 203 is amplified with the amplifier 204, and output to the multiplication circuit 207.

Even after the reference signal has been switched to the 2f0 signal, an optical signal is still output from the modulator 102 to which the control voltage on which the f0 signal is superimposed is applied. The optical signal is monitored with the PD 107, and the monitor signal is input to the I/V converter 206. With the I/V converter 206, the monitor signal is amplified by current-voltage conversion, and output to the multiplication circuit 207. In this manner, because the monitor signal and the reference signal (2f0 signal in this operation) are input to the multiplication circuit 207, multiplication of the monitor signal and the reference signal is performed (Step S108).

The multiplication result is subjected to A/D conversion with the AD converter 208, and filtered with the low-pass filter 209 (Step S109). Because the low-pass filter 209 transmits only a low-frequency band component of the multiplication result, a direct-current component included in the multiplication result is output from the low-pass filter 209. The direct-current component is input to the operating point determination unit 210, and used for determination to bring the operating point of the modulator 102 close to the optimum value.

Specifically, it is determined whether the direct-current component is equal to or smaller than a predetermined threshold 2 (Step S110). As explained with reference to FIG. 3 to FIG. 5, because the dither signal component having the frequency 2f0 included in the monitor signal increases as the operating point of the modulator 102 becomes close to the optimum value, the direct-current component increases as the operating point of the modulator 102 becomes close to the optimum value, when the reference signal is the 2f0 signal. For this reason, when the direct-current component is not equal to or smaller than the predetermined threshold 2 (No at Step S110), the control voltage applied to the modulator 102 with the voltage controller 205 is updated such that the direct-current component becomes maximum and the operating point becomes close to the optimum value (Step S111). The updated value of the control voltage may be a value instructed from the operating point determination unit 210.

As described above, when the direct-current component becomes equal to or smaller than the predetermined threshold 1 in the state in which the reference signal is the f0 signal, the reference signal is switched to the 2f0 signal, and the control voltage is updated to increase the direct-current component. Specifically, until the operating point becomes close to the optimum value to a certain degree, the control voltage is regulated by detecting the dither signal component having the frequency f0 the amplitude of which decreases as the operating point becomes close to the optimum value. After the operating point has become close to the optimum value to a certain degree, the control voltage is regulated by detecting the dither signal component having the frequency 2f0 the amplitude of which increases as the operating point becomes close to the optimum value. This structure surely brings the operating point close to the optimum value without decreasing the detection accuracy of the dither signal component even when the operating point becomes close to the optimum value.

Even when control to bring the operating point of the modulator 102 close to the optimum value is being performed, there are cases where the direct-current component output from the low-pass filter 209 is equal to or smaller than the predetermined threshold 2, for example, due to change in temperature and/or aged deterioration on the optical output characteristic curve of the modulator 102 (Yes at Step S110). In this case, by issuing an instruction from the operating point determination unit 210 to the switching unit 203, the reference signal is switched to the f0 signal again (Step S102). Thereafter, by repeating the processing described above, the optimum operating point is determined in accordance with the changed optical output characteristic curve.

This example illustrates the operating point control method for setting the operating point of the modulator 102 to an optimum value, but the operating points of the VOA 103 and the TOF 105 can be set to optimum values by the similar operating point control method. In the case of setting the operating points of the VOA 103 and the TOF 105 to optimum values, the maximum points in the optical output characteristic curves of the VOA 103 and the TOF 105 are specified by the operating point control method described above. In addition, on the basis of the specified maximum points, the control voltages for the VOA 103 and the TOF 105 to acquire the desired optical intensities are determined.

As described above, according to the present embodiment, the operating point of the optical device is controlled on the basis of the direct-current component included in the multiplication result of the monitor signal and the reference signal, the frequency of the reference signal is set to f0 that is the same as that of the dither signal until the operating point becomes close to the optimum value to a certain degree, and the frequency of the reference signal is set to 2f0 twice as large as that of the dither signal after the operating point has become close to the optimum value to a certain degree. With this structure, even when the amplitude of the dither signal component included in the monitor signal is small, by increasing the amplitude of the reference signal, the direct-current component included in the multiplication result is increased, and the detection accuracy of the dither signal component can be improved. In addition, even after the operating point has become close to the optimum value to a certain degree, the operating point can be controlled in accordance with the dither signal component having the frequency 2f0 the amplitude of which increases as the operating point becomes close to the optimum value. As a result, the optical device can be operated with a desired optical output characteristic.

[b] Second Embodiment

The second embodiment is characterized in switching the frequency of the dither signal instead of the frequency of the reference signal.

A configuration of an optical module according to the second embodiment is the same as the optical module 100 (FIG. 1) according to the first embodiment, and an explanation thereof is omitted. In the second embodiment, configurations of the operating point controllers 140, 150, and 160 are different from those of the first embodiment.

Figure 9:
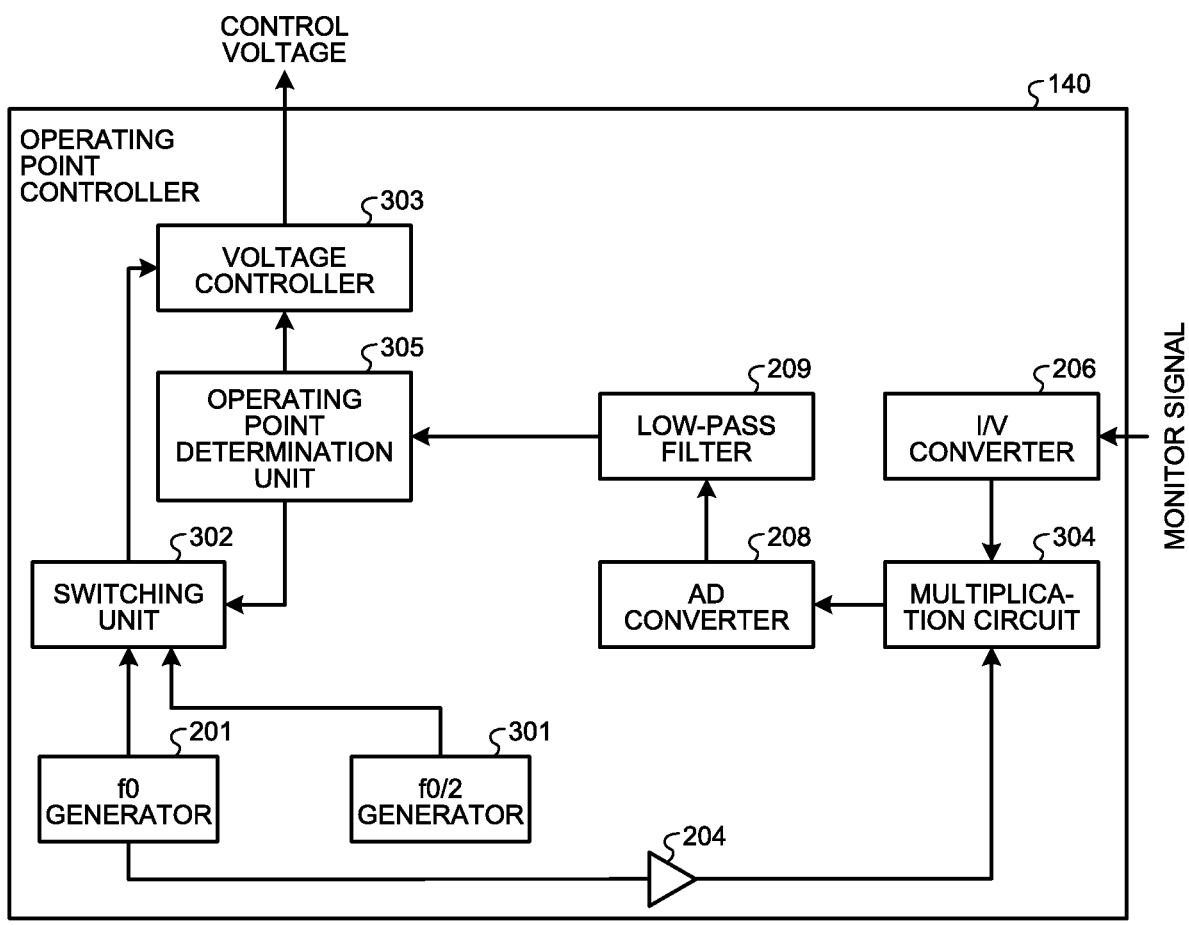
FIG. 9 is a block diagram illustrating a configuration of an operating point controller according to a second embodiment.

FIG. 9 is a block diagram illustrating a configuration of the operating point controller 140 according to the second embodiment. In FIG. 9, the same constituent elements as those of FIG. 2 are denoted with the same reference numerals, and an explanation thereof is omitted. The operating point controllers 150 and 160 have the same configuration as that of the operating point controller 140 except that the operating point control target is different. The operating point controller 140 illustrated in FIG. 9 includes an f0/2 generator 301 and a switching unit 302, instead of the 2f0 generator 202 and the switching unit 203 illustrated in FIG. 2, and includes a voltage controller 303, a multiplication circuit 304, and an operating point determination unit 305, instead of the voltage controller 205, the multiplication circuit 207, and the operating point determination unit 210.

The f0/2 generator 301 generates a signal (hereinafter referred to as "f0/2 signal") having a frequency f0/2 and used as a dither signal. Specifically, the f0/2 generator 301 generates a dither signal having a frequency half the frequency f0. The f0/2 generator 301 outputs the generated f0/2 signal to the switching unit 302.

The switching unit 302 outputs a f0 signal or a f0/2 signal as the dither signal to the voltage controller 303, in accordance with an instruction from the operating point determination unit 305. Specifically, when the operating point of the modulator 102 becomes close to the optimum value, the switching unit 302 switches the dither signal from the f0 signal to the f0/2 signal. By contrast, when the operating point of the modulator 102 becomes distant from the optimum value, the switching unit 302 switches the dither signal from the f0/2 signal to the f0 signal.

The voltage controller 303 applies the control voltage to the modulator 102 to control the operating point. In this operation, the voltage controller 303 sets the voltage value of the control voltage in accordance with an instruction from the operating point determination unit 305, superimposes the f0 signal or the f0/2 signal serving as the dither signal on the control voltage, and applies the control voltage to the modulator 102.

The multiplication circuit 304 multiplies the monitor signal by the reference signal, and detects a dither signal component included in the monitor signal. Specifically, the multiplication circuit 304 multiplies the monitor signal monitored with the PD 107 by the f0 signal corresponding to the dither signal component. By the multiplication, when the same frequency component as the reference signal is included in the monitor signal, a direct-current component occurs in the multiplication result. Accordingly, even when the dither signal is either of the f0 signal and the f0/2 signal, the multiplication circuit 304 outputs a multiplication result including a direct-current component when the monitor signal includes a dither signal component having a frequency f0. The magnitude of the direct-current component is proportional to the magnitude of amplitude of the multiplied reference signal. For this reason, amplifying the reference signal with the amplifier 204 enables increase of the direct-current component appearing in the multiplication result of the multiplication circuit 304, and enables accurate detection of the dither signal component from the monitor signal.

The operating point determination unit 305 performs control such that the operating point of the modulator 102 becomes close to the optimum value, on the basis of the output of the low-pass filter 209. Specifically, when the optical module 100 is started, the operating point determination unit 305 instructs the switching unit 302 to switch the dither signal to the f0 signal. In addition, the operating point determination unit 305 causes the voltage controller 303 to change the control voltage such that the direct-current component extracted with the low-pass filter 209 is equal to or smaller than a predetermined threshold. The operating point determination unit 305 instructs the switching unit 302 to change the dither signal to the f0/2 signal, when the direct-current component is equal to or smaller than the predetermined threshold in the state in which the dither signal is the f0 signal. In addition, the operating point determination unit 305 causes the voltage controller 303 to change the control voltage such that the direct-current component extracted with the low-pass filter 209 increases. The operating point determination unit 305 determines that the operating point has the optimum value, when the direct-current component becomes maximum in the state in which the dither signal is the f0/2 signal.

Figure 10:
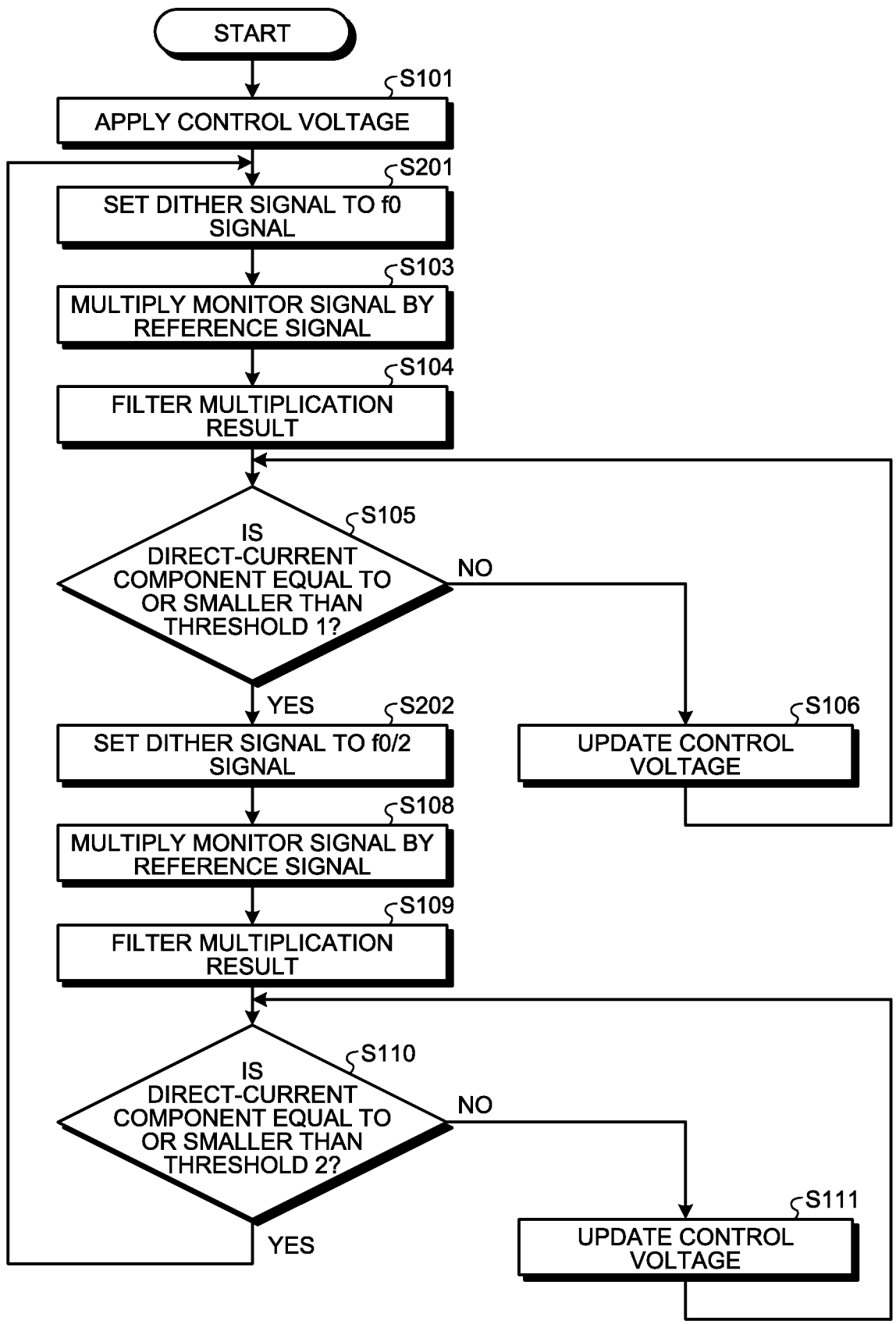
FIG. 10 is a flowchart illustrating an operating point control method according to the second embodiment.

The following is an explanation of the operating point control method with the operating point controller 140 structured as described above, with reference to the flowchart illustrated in FIG. 10. In FIG. 10, the same constituent elements as those in FIG. 7 are denoted with the same reference numerals, and a detailed explanation thereof is omitted.

When the optical module 100 is started, a control voltage having a predetermined initial value is applied to the modulator 102 with the voltage controller 303 (Step S101). In this operation, by controlling the switching unit 302 with the operating point determination unit 305, the dither signal output to the voltage controller 303 is set to the f0 signal (Step S201). Specifically, the f0 signal generated with the f0 generator 201 is set to be output from the switching unit 302 to the voltage controller 303. In this manner, because the f0 signal output from the f0 generator 201 is superimposed on the control voltage in the voltage controller 303, the control voltage on which the f0 signal is superimposed is applied to the modulator 102.

When the control voltage is applied to the modulator 102, the light output from the light source 106 is modulated with the electrical signal output from the driver 101, and an optical signal is output from the modulator 102. The optical signal is monitored with the PD 107, and the monitor signal is amplified with the I/V converter 206 and thereafter output to the multiplication circuit 304. In addition, the f0 signal generated with the f0 generator 201 is amplified with the amplifier 204, and output to the multiplication circuit 304. In this manner, because the monitor signal and the reference signal are input to the multiplication circuit 304, multiplication of the monitor signal and the reference signal is performed (Step S103).

The multiplication result is subjected to A/D conversion with the AD converter 208, and filtered with the low-pass filter 209 (Step S104). The direct-current component output from the low-pass filter 209 is input to the operating point determination unit 305, and used for determination to bring the operating point of the modulator 102 close to the optimum value.

Specifically, it is determined with the operating point determination unit 305 whether the direct-current component is equal to or smaller than a predetermined threshold 1 (Step S105). As explained in the first embodiment, because the dither signal component having the frequency f0 included in the monitor signal decreases as the operating point of the modulator 102 becomes close to the optimum value, the direct-current component decreases as the operating point of the modulator 102 becomes close to the optimum value. For this reason, when the direct-current component is not equal to or smaller than the predetermined threshold 1 (No at Step S105), it is determined that the operating point of the modulator 102 is distant from the optimum value, and the control voltage applied to the modulator 102 with the voltage controller 303 is updated (Step S106). The updated value of the control voltage may be a value instructed from the operating point determination unit 305.

By contrast, when the direct-current component is equal to or smaller than the predetermined threshold 1 (Yes at Step S105), it is determined that the operating point of the modulator 102 becomes close to the optimum value, and the dither signal is switched to the f0/2 signal with an instruction issued from the operating point determination unit 305 to the switching unit 302 (Step S202). Specifically, with the switching unit 302, the f0/2 signal output from the f0/2 generator 301 is output as the dither signal to the voltage controller 303, not the f0 signal output from the f0 generator 201. The reference signal input to the multiplication circuit 207 is maintained at the f0 signal and not changed.

After the dither signal has been switched to the f0/2 signal, the control voltage on which the f0/2 signal is superimposed is applied to the modulator 102, and an optical signal is still output. The optical signal is monitored with the PD 107, and the monitor signal is amplified with the I/V converter 206 and thereafter output to the multiplication circuit 304. In this manner, because the monitor signal and the reference signal are input to the multiplication circuit 304, multiplication of the monitor signal and the reference signal is performed (Step S108).

The multiplication result is subjected to A/D conversion with the AD converter 208, and filtered with the low-pass filter 209 (Step S109). Because the low-pass filter 209 transmits only a low-frequency band component of the multiplication result, a direct-current component included in the multiplication result is output from the low-pass filter 209. The direct-current component is input to the operating point determination unit 305, and used for determination to bring the operating point of the modulator 102 close to the optimum value.

Specifically, it is determined whether the direct-current component is equal to or smaller than a predetermined threshold 2 (Step S110). As explained in the first embodiment, because the dither signal component having the frequency twice as large as that of the dither signal included in the monitor signal increases as the operating point of the modulator 102 becomes close to the optimum value, the direct-current component increases as the operating point of the modulator 102 becomes close to the optimum value, when the reference signal is the f0/2 signal. For this reason, when the direct-current component is not equal to or smaller than the predetermined threshold 2 (No at Step S110), the control voltage applied to the modulator 102 with the voltage controller 303 is updated such that the direct-current component remains to be maximum and the operating point remains to be close to the optimum value (Step S111). The updated value of the control voltage may be a value instructed from the operating point determination unit 305.

As described above, when the direct-current component becomes equal to or smaller than the predetermined threshold 1 in the state in which the dither signal is the f0 signal, the dither signal is switched to the f0/2 signal, and the control voltage is updated to increase the direct-current component. Specifically, until the operating point becomes close to the optimum value to a certain degree, the control voltage is regulated by detecting the dither signal component having the same frequency f0 as the frequency f0 of the dither signal. After the operating point has become close to the optimum value to a certain degree, the control voltage is regulated by detecting the dither signal component having the frequency f0 twice as large as the frequency f0/2 of the dither signal. This structure surely brings the operating point close to the optimum value without decreasing the detection accuracy of the dither signal component even when the operating point becomes close to the optimum value.

This example illustrates the operating point control method for setting the operating point of the modulator 102 to an optimum value, but the operating points of the VOA 103 and the TOF 105 can be set to optimum values by the similar operating point control method. In the case of setting the operating points of the VOA 103 and the TOF 105 to optimum values, the maximum points in the optical output characteristic curves of the VOA 103 and the TOF 105 are specified by the operating point control method described above. In addition, on the basis of the specified maximum points, the control voltages for the VOA 103 and the TOF 105 to acquire the desired optical intensities are determined.

As described above, according to the present embodiment, the operating point of the optical device is controlled on the basis of the direct-current component included in the multiplication result of the monitor signal and the reference signal, the frequencies of the dither signal and the reference signal are set to the same frequency f0 until the operating point becomes close to the optimum value to a certain degree, and the frequency of the dither signal is set to f0/2 that is half the frequency of the dither signal after the operating point has become close to the optimum value to a certain degree. With this structure, even when the amplitude of the dither signal component included in the monitor signal is small, by increasing the amplitude of the reference signal, the direct-current component included in the multiplication result is increased, and the detection accuracy of the dither signal component can be improved. In addition, even after the operating point has become close to the optimum value to a certain degree, the operating point can be controlled by causing the dither signal component having the frequency f0 the amplitude of which increases as the operating point becomes close to the optimum value to appear in the monitor signal. As a result, the optical device can be operated with a desired optical output characteristic.

Figure 11:
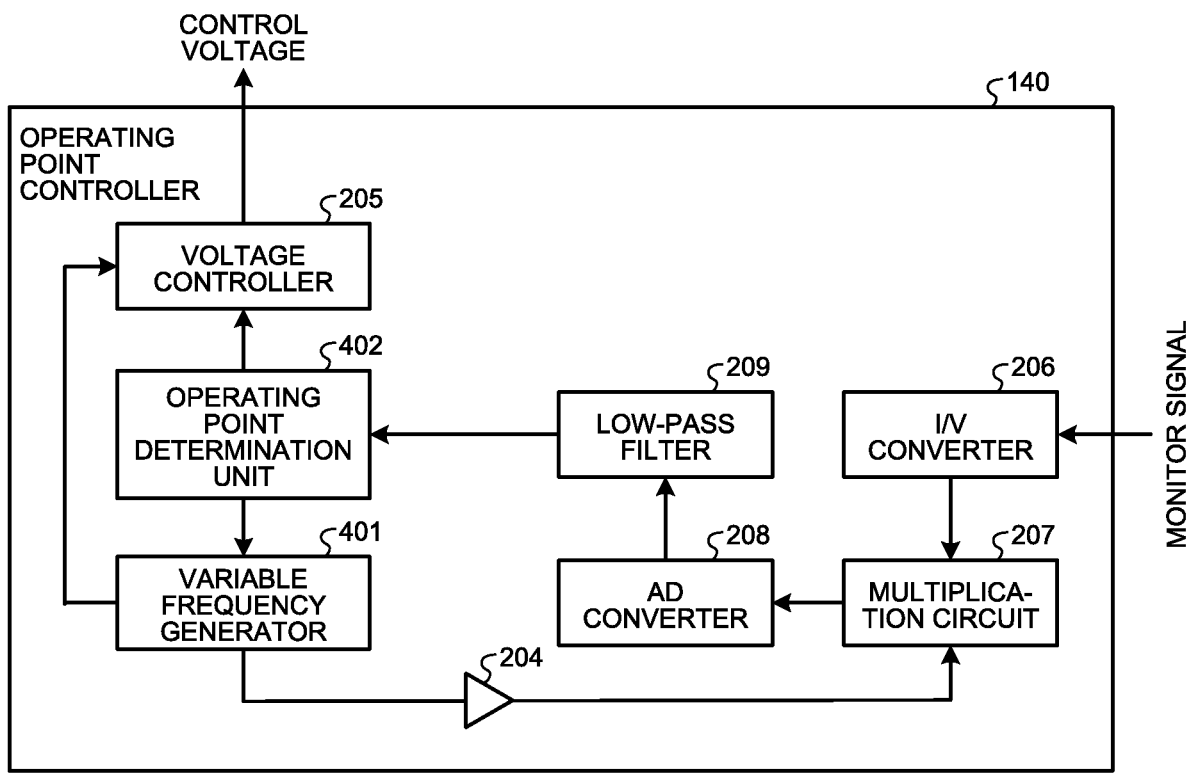
FIG. 11 is a block diagram illustrating a configuration of an operating point control method according to another embodiment.

Each of the embodiments described above has the structure in which the f0 signal, the 2f0 signal, and the f0/2 signal are generated with the f0 generator 201, the 2f0 generator 202, and the f0/2 generator 301, respectively, but these generators are not always provided as separate members. Specifically, these signals having different frequencies may be generated using, for example, an oscillator and a frequency divider. As another example, as illustrated in FIG. 11, the operating point controller 140 may be provided with a variable frequency generator 401 generating a desired frequency, and the frequency of the dither signal or the reference signal may be switched in the same manner as the first and the second embodiments described above.

In addition, when the operating point controller 140 includes the variable frequency generator 401, the frequency of the dither signal can be set such that the frequency of the dither signal does not overlap the frequency of noise. Specifically, after the optical module 100 is started, an operating point determination unit 402 causes the variable frequency generator 401 to successively generate frequencies from the minimum frequency to the maximum frequency that can be generated with the variable frequency generator 401, before an electrical signal is input from the driver 101 to the modulator 102. Thereafter, the variable frequency generator 401 outputs each of signals of the generated frequencies to the multiplication circuit 207, and the multiplication circuit 207 performs multiplication. In this operation, because no electrical signal has been input to the modulator 102 and no optical signal has been output from the modulator 102, it is noise that is input as the monitor signal to the multiplication circuit 207. For this reason, the multiplication circuit 207 multiplies the noise by each of the signals from the variable frequency generator 401.

Each of the multiplication results is input to the operating point determination unit 402 via the AD converter 208 and the low-pass filter 209. In this operation, when the noise and the signal from the variable frequency generator 401 have the same frequency, a direct-current component is output from the low-pass filter 209. For this reason, the operating point determination unit 402 specifies the frequency of the noise, on the basis of the frequency generated with the variable frequency generator 401 and presence/absence of the direct-current component from the low-pass filter 209. Specifically, the operating point determination unit 402 specifies the frequency generated with the variable frequency generator 401 when a direct-current component is output from the low-pass filter 209, as the frequency of the noise.

As described above, the operating point determination unit 402 is capable of specifying the frequency of noise, and setting the frequency of the dither signal superimposed on the control voltage to a frequency different from the frequency of the noise. Specifically, the operating point determination unit 402 instructs the variable frequency generator 401 to generate a dither signal having a frequency different from the frequency of the noise. In addition, the operating point determination unit 402 preferably instructs the variable frequency generator 401 to generate a dither signal having a frequency different from a frequency half the frequency of the noise. This is because, when the operating point becomes close to the optimum value, the dither signal component having a frequency twice as large as the frequency of the dither signal appears in the monitor signal, and the frequency of the dither signal component becomes equal to the frequency of the noise when the frequency of the dither signal is half the frequency of the noise.

According to one aspect of the optical module, the transmission device, and the operating point control method disclosed in the present application produces the effect of enabling the optical device to operate with a desired optical output characteristic.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
   an optical device that outputs an optical signal with an optical output characteristic corresponding to a control voltage;
   a voltage controller that applies the control voltage on which a dither signal having a known frequency is superimposed to the optical device;
   a monitor unit that monitors the optical signal output from the optical device, and outputs a monitor signal corresponding to the optical signal output;
   a multiplier that multiplies the monitor signal by a reference signal having a frequency corresponding to the dither signal;
   a filter unit that extracts a direct-current component included in a multiplication result of the multiplier; and
   a controller that causes the voltage controller to change the control voltage in accordance with the direct-current component extracted with the filter unit, wherein
   the controller changes the frequency of the dither signal or the reference signal such that the frequency of the reference signal is twice as large as the frequency of the dither signal, when the direct-current component extracted with the filter unit satisfies a predetermined condition.

2. The optical module according to claim 1, wherein the controller changes the frequency of the reference signal to a twice frequency, when the direct-current component extracted with the filter unit is equal to or smaller than a predetermined first threshold in a state in which the frequency of the reference signal is equal to the frequency of the dither signal.

3. The optical module according to claim 1, wherein the controller changes the frequency of the dither signal to a half frequency, when the direct-current component extracted with the filter unit is equal to or smaller than a predetermined first threshold in a state in which the frequency of the reference signal is equal to the frequency of the dither signal.

4. The optical module according to claim 1, wherein the controller changes the frequency of the dither signal or the reference signal such that the frequency of the reference signal is equal to the frequency of the dither signal, when the direct-current component extracted with the filter unit is equal to or smaller than a predetermined second threshold in a state in which the frequency of the reference signal is twice as large as the frequency of the dither signal.

5. A transmission device that transmits an optical signal, the transmission device comprising:
   an optical device that outputs the optical signal with an optical output characteristic corresponding to a control voltage;
   a voltage controller that applies the control voltage on which a dither signal having a known frequency is superimposed to the optical device;
   a monitor unit that monitors the optical signal output from the optical device, and outputs a monitor signal corresponding to the optical signal output;
   a multiplier that multiplies the monitor signal by a reference signal having a frequency corresponding to the dither signal;
   a filter unit that extracts a direct-current component included in a multiplication result of the multiplier; and
   a controller that causes the voltage controller to change the control voltage in accordance with the direct-current component extracted with the filter unit, wherein
   the controller changes the frequency of the dither signal or the reference signal such that the frequency of the reference signal is twice as large as the frequency of the dither signal, when the direct-current component extracted with the filter unit satisfies a predetermined condition.

6. An operating point control method for an optical device that outputs an optical signal with an optical output characteristic corresponding to a control voltage, the method comprising:
   applying the control voltage on which a dither signal having a known frequency is superimposed to the optical device;
   monitoring the optical signal output from the optical device, and acquiring a monitor signal corresponding to the optical signal output;
   multiplying the monitor signal by a reference signal having a frequency corresponding to the dither signal;
   extracting a direct-current component included in a multiplication result;
   changing the control voltage in accordance with the direct-current component; and
   changing the frequency of the dither signal or the reference signal such that the frequency of the reference signal is twice as large as the frequency of the dither signal, when the direct-current component satisfies a predetermined condition.

* * * * *